US010789895B2

(12) United States Patent
Chou et al.

(10) Patent No.: US 10,789,895 B2
(45) Date of Patent: Sep. 29, 2020

(54) DIFFERENTIAL DIFFERENCE AMPLIFIER CIRCUIT HAVING VARIABLE TRANSCONDUCTANCE

(71) Applicant: NOVATEK MICROELECTRONICS CORP., HsinChu (TW)

(72) Inventors: Chih-Hsien Chou, Hsinchu (TW); Po-Yu Tseng, Zhongli (TW); Jhih-Siou Cheng, New Taipei (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 75 days.

(21) Appl. No.: 16/009,290

(22) Filed: Jun. 15, 2018

(65) Prior Publication Data

US 2019/0385536 A1   Dec. 19, 2019

(51) Int. Cl.
*G09G 3/36* (2006.01)
*G09G 3/3283* (2016.01)
*H03F 3/45* (2006.01)

(52) U.S. Cl.
CPC ......... *G09G 3/3283* (2013.01); *G09G 3/3685* (2013.01); *H03F 3/45475* (2013.01); *G09G 2310/0291* (2013.01); *H03F 2200/129* (2013.01); *H03F 2203/45116* (2013.01)

(58) Field of Classification Search
CPC ..... G09G 2300/043; G09G 2300/0828; G09G 2310/027; G09G 2310/0291; G09G 2320/0247; G09G 2320/0673; G09G 2330/028; G09G 3/2092; G09G 3/3659; G09G 3/3688; G09G 3/3696
See application file for complete search history.

(56) References Cited

U.S. PATENT DOCUMENTS

| 2009/0206930 A1* | 8/2009 | Huang ................ H03F 3/45183 330/253 |
| 2013/0049863 A1* | 2/2013 | Chiu ..................... H03F 1/3211 330/253 |
| 2014/0247202 A1* | 9/2014 | Kamizuru ............ G09G 3/3696 345/89 |

* cited by examiner

*Primary Examiner* — Ram A Mistry
(74) *Attorney, Agent, or Firm* — McClure, Qualey & Rodack, LLP

(57) ABSTRACT

The differential difference amplifier circuit includes a differential input stage circuit, a loading stage circuit coupled to the differential input stage circuit, and an output stage circuit coupled to the loading stage circuit. The output stage circuit is configured to generate an output signal. The differential input stage circuit includes a first differential pair having a first transconductance and a second differential pair having a second transconductance. The first differential pair is biased by a first current source and receives a first input signal and the output signal. The second differential pair is biased by a second current source and receives a second input signal and the output signal. At least one of the first transconductance and the second transconductance is adjusted according to the image data.

9 Claims, 12 Drawing Sheets

DIFFERENTIAL DIFFERENCE AMPLIFIER CIRCUIT HAVING VARIABLE TRANSCONDUCTANCE

TECHNICAL FIELD

The disclosure relates in general to a differential difference amplifier circuit in a data driver, and more particularly to a differential difference amplifier circuit including a differential pair having a variable transconductance.

BACKGROUND

An operational amplifier circuit has a variety of applications in modern electronic devices. For example, the operational amplifier circuit may be used in a data driver for providing image data to a display panel, such as an organic light emitting diode (OLED) and a liquid crystal display (LCD) panel. It is common for an operational amplifier to adopt a differential pair as an input stage for receiving input signals. How to design a differential pair in the data driver to achieve better display quality is an important subject in the industry.

SUMMARY

The disclosure is directed to a differential difference amplifier circuit having a variable transconductance that may achieve differential nonlinearity (DNL) randomization.

According to one embodiment of the invention, a differential difference amplifier circuit in a data driver for providing image data to a display panel is provided. The differential difference amplifier circuit includes a differential input stage circuit, a loading stage circuit coupled to the differential input stage circuit, and an output stage circuit coupled to the loading stage circuit. The output stage circuit is configured to generate an output signal. The differential input stage circuit includes a first differential pair having a first transconductance and a second differential pair having a second transconductance. The first differential pair is biased by a first current source and receives a first input signal and the output signal. The second differential pair is biased by a second current source and receives a second input signal and the output signal. At least one of the first transconductance and the second transconductance is adjusted according to image data.

According to one embodiment of the invention, a differential difference amplifier circuit in a data driver for providing image data to a display panel is provided. The differential difference amplifier circuit includes a differential input stage circuit, a loading stage circuit coupled to the differential input stage circuit, and an output stage circuit coupled to the loading stage circuit. The output stage circuit is configured to generate an output signal. The differential input stage circuit includes: a first differential pair and a second differential pair. The first differential pair is biased by a first current source and receives a first input signal and an output signal. The second differential pair is biased by a second current source and receives a second input signal and the output signal. The magnitude of the first current source is controlled by a bias voltage generated by a bias generation circuit. The bias generation circuit comprises a first transistor, a second transistor, and a third switch coupled between a control terminal of the first transistor and a control terminal of the second transistor. The third switch is controlled by a control signal.

According to one embodiment of the invention, a differential difference amplifier circuit in a data driver for providing image data to a display panel is provided. The differential difference amplifier circuit includes a differential input stage circuit, a loading stage circuit coupled to the differential input stage circuit, and an output stage circuit coupled to the loading stage circuit. The output stage circuit is configured to generate an output signal. The differential input stage circuit includes a first differential pair and a second differential pair. The first differential pair is biased by a first current source and receives a first input signal and an output signal. The second differential pair is biased by a second current source and receives a second input signal and the output signal. The magnitude of the first current source is controlled by a bias voltage generated by a bias generation circuit. The bias generation circuit comprises a first transistor and a variable current source coupled to the first transistor, wherein a magnitude of the variable current source is controlled by a control signal.

The invention will become apparent from the following detailed description of the preferred but non-limiting embodiments. The following description is made with reference to the accompanying drawings.

Figure 1:
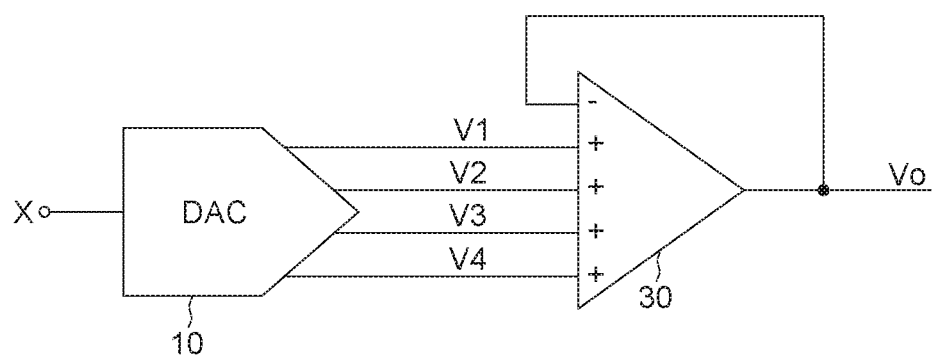
FIG. 1 shows a circuit diagram of a data driver for a display panel.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a circuit diagram of a data driver 1 for a display panel. The data driver 1 is configured to convert a digital code representing the image data X to an analog voltage Vo for driving the display panel. The data driver 1 includes a digital-to-analog converter (DAC) 10 and a differential difference amplifier circuit (DDA) 30. The DAC 10 and the DDA 30 collaborate to complete the data conversion task for the image data X, which may be divided into a high part Xa and a low part Xb. In one embodiment, the DAC 10 takes charge of the high part Xa, and the DDA 30 takes charge of the low part Xb. For example, the image data X has 10 bits, and the high part Xa represents the 7 most significant bits (MSB) of the image data X, and the low part Xb represents the 3 least significant bits (LSB) of the image data X. The DAC 10 has four output terminals V1-V4, and each output terminal V1-V4 is assigned either a high voltage level VH or a low voltage level VL by the DAC 10. The DAC 10 is configured to determine what the high voltage level VH and the low voltage level VL are according to the high part Xa, and configured to determine how the high voltage level VH and the low voltage level VL are assigned to the output terminals V1-V4 according to the low part Xb. The DDA 30 is configured to generate the output signal Vo according to the input signals V1-V4, effectively interpolating between the high voltage level VH and the low voltage level VL. As such, the data driver 10 that converts the 10-bit image data X to the output signal Vo only requires the DAC 10 to have a resolution of 7 bits, effectively reducing the hardware cost of the DAC 10. The remaining 3 least significant bits can be handled by the DDA 30. In the following description, the DDA 30 receiving four input signals V1-V4 for dealing with a 3-bit input code will be used an example. However, it should be appreciated that the numbers and the bit widths given above are merely exemplary rather than limiting. Moreover, the number of voltage levels applied to the DDA 30 is not limited to two (VH and VL), more voltage levels may also be applicable in other embodiments.

Figure 2:
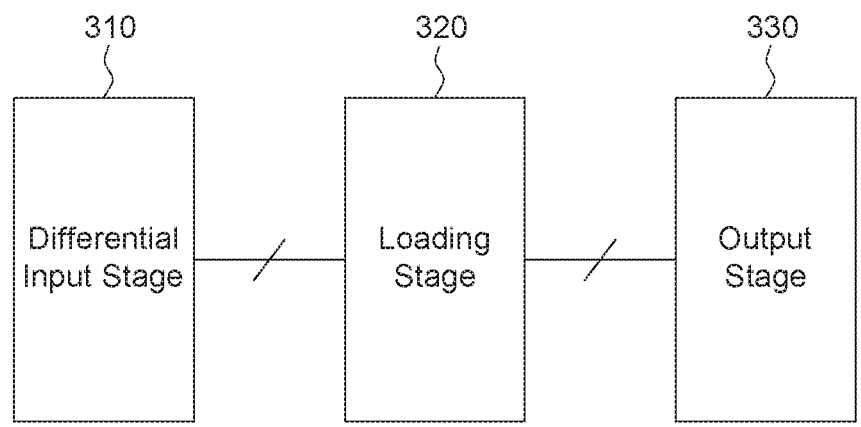
FIG. 2 shows a block diagram of a differential difference amplifier circuit.

FIG. 2 shows a block diagram of a differential difference amplifier circuit. The DDA 30 in FIG. 1 includes a differential input stage circuit 310, a loading stage circuit 320 coupled to the differential input stage circuit 310, and an output stage circuit 330 coupled to the loading stage circuit 320. The output stage circuit 330 is configured to generate the output signal Vo. The output stage circuit 330 may include power MOSFETs to provide sufficient driving capability or to enhance voltage gain. In other words, the main function of the output stage circuit 330 is to increase driving strength and to enhance circuit performance. The output signal Vo can still be generated correctly even without the output stage circuit 330. In one embodiment, the loading stage circuit 320 is configured to convert differential currents outputted by the differential input stage circuit 310 to an output voltage. The loading stage circuit 320 may include an active load circuit (such as transistors) or a passive load circuit (such as resistors, capacitors, and inductors). The active load circuit may also be referred to as the gain stage circuit. The combination of the differential input stage circuit 310 and the loading stage circuit 320 may be referred to as the $1^{st}$ stage operational amplifier (OP). The output stage circuit 330 may be referred to as the $2^{nd}$ stage OP. In other embodiments, there may be only one stage OP or more than two stages of OP. For example, the $2^{nd}$ stage OP (as well as other $3^{rd}$, $4^{th}$ ... stage OP) may be optionally removed.

Figure 3A:
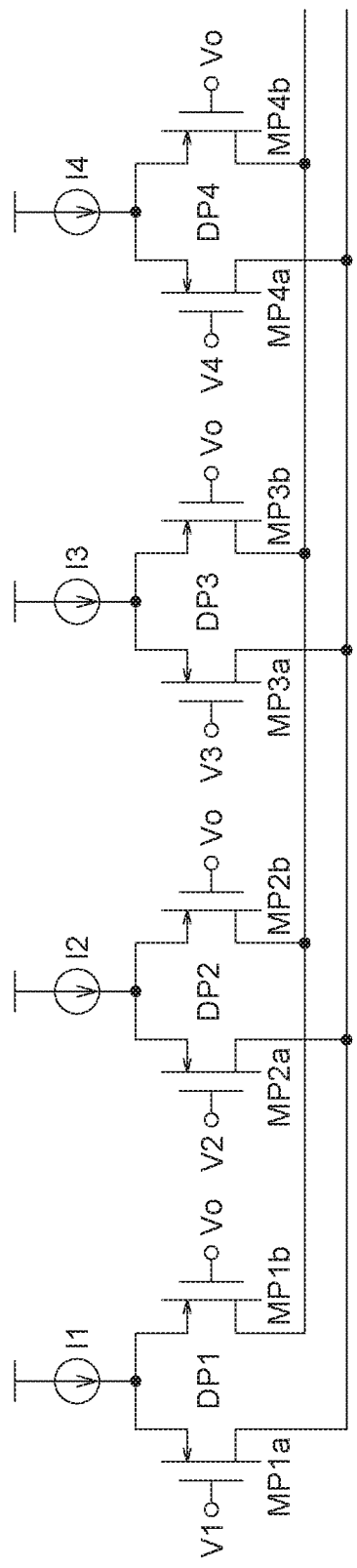
FIG. 3A shows a circuit diagram of a differential input stage circuit according to one embodiment of this disclosure.

FIG. 3A shows a circuit diagram of a differential input stage circuit according to one embodiment of this disclosure. In this embodiment, the differential input stage circuit 310a includes four differential pairs DP1 to DP4, corresponding to the input signals V1 to V4 respectively. The differential pair DP1 includes a transistor MP1a for receiving the input signal V1, a transistor MP1b for receiving the output signal, and a current source I1. The differential pair DP1 has a transconductance Gm1. Assume the two PMOS transistors MP1a and MP1b have equal gate width and equal gate length, the calculation of the transconductance Gm1 is as follows: the drain currents $i_1$ and $i_2$ of the two transistors MP1a and MP1b may be represented by the following equations:

$$i_1 = \frac{I_{SS}}{2} + \sqrt{\mu_p C_{ox} \frac{W}{L} I_{SS}} \left(\frac{v_{id}}{2}\right) \sqrt{1 - \frac{(v_{id}/2)^2}{1/\mu_p C_{ox} \frac{W}{L}}} \quad \text{(Eq. 1A)}$$

$$i_2 = \frac{I_{SS}}{2} - \sqrt{\mu_p C_{ox} \frac{W}{L} I_{SS}} \left(\frac{v_{id}}{2}\right) \sqrt{1 - \frac{(v_{id}/2)^2}{1/\mu_p C_{ox} \frac{W}{L}}} \quad \text{(Eq. 1B)}$$

Where $I_{SS}$ is $I_1$ of the differential pair DP1, $\mu_p$ is the charge-carrier effective mobility, W is the gate width of the PMOS transistor, L is the gate length of the PMOS transistor, $C_{ox}$ is the gate oxide capacitance per unit area, and $v_{id}$ is the input voltage difference, in this example $v_{id}$=V1−$V_o$. Based on (Eq. 1A) and (Eq. 1B), when $$\frac{v_{id}}{2} \ll \sqrt{\frac{I}{\mu_p C_{ox} \frac{W}{L}}}, \quad \text{(Eq. 2)}$$

the drain currents $i_1$ and $i_2$ may be approximately represented as a linear relation as follows:

$$i_1 = \frac{I_{SS}}{2} + \sqrt{\mu_p C_{ox} \frac{W}{L} I_{SS}} \left(\frac{v_{id}}{2}\right) \quad \text{(Eq. 3A)}$$

$$i_2 = \frac{I_{SS}}{2} - \sqrt{\mu_p C_{ox} \frac{W}{L} I_{SS}} \left(\frac{v_{id}}{2}\right) \quad \text{(Eq. 3B)}$$

That is, when the condition in (Eq. 2) is satisfied, the relation between the drain current and the input voltage difference $v_{id}$ is linear. The transconductance Gm1 of the differential pair DP1 is:

$$Gm1 = \frac{i_1}{v_{id}/2} = \sqrt{\mu_p C_{ox} \frac{W}{L} I_{SS}} \quad \text{(Eq. 4)}$$

The transconductance formula given above may also apply to other differential pairs DP2-DP4. Although PMOS differential pair is used an example, the calculation for transconductance of NMOS differential pair is similar (replacing hole mobility $\mu_p$ by electron mobility $\mu_n$), and thus is not repeated herein. As can be seen in (Eq. 4), the transconductance Gm is related to the size of the transistor and the magnitude of the current source.

Other differential pairs DP2-DP4 have similar structures to the differential pair DP1. The differential pair DP2 is biased by the current source I2, receives the input signal V2 and the output signal Vo, and has a transconductance Gm2. The differential pair DP3 has a transconductance Gm3, and the differential pair DP4 has a transconductance Gm4. By introducing the negative feedback of the output signal Vo, the differential input stage circuit 310a achieves a voltage interpolation function, where the output signal Vo may be expressed as:

$$V_O = \frac{Gm1 \times V1 + Gm2 \times V2 + Gm3 \times V3 + Gm4 \times V4}{Gm1 + Gm2 + Gm3 + Gm4} \quad \text{(Eq. 5)}$$

The transconductance of each differential pair may be adjusted by appropriately setting the transistor size or the magnitude of the current source in the differential pair according to (Eq. 4). In one embodiment, by setting Gm4=2×Gm3=4×Gm2=4×Gm1, (Eq. 5) can be expressed as $$V_O = \frac{V1 + V2 + 2 \times V3 + 4 \times V4}{8}. \quad \text{(Eq. 6)}$$

The ratio between the transconductance of differential pairs given above is merely an example. Other ratios may also be applicable, which may result in different interpolation functions.

Based on the (Eq. 6), the DAC 10 in FIG. 1 can assign either the high voltage level VH or the low voltage level VL to the input signals V1 to V4 according to the input code Xb, such that different voltage levels between the high voltage level VH and the low voltage level VL can be interpolated. The following Table 1 shows the voltage assignment and the interpolation result corresponding to the different input code Xb.

In the embodiment given above, the input signals V1-V4 can be two different voltage levels VH or VL, such that the voltage levels between VH and VL can be interpolated with $2^N$ steps, where N=3 in this example. In another embodiment, the input signals V1-V4 may have four different voltage levels. N may be other integer values as well, depending on the bit width of DAC 10.

Figure 3B:
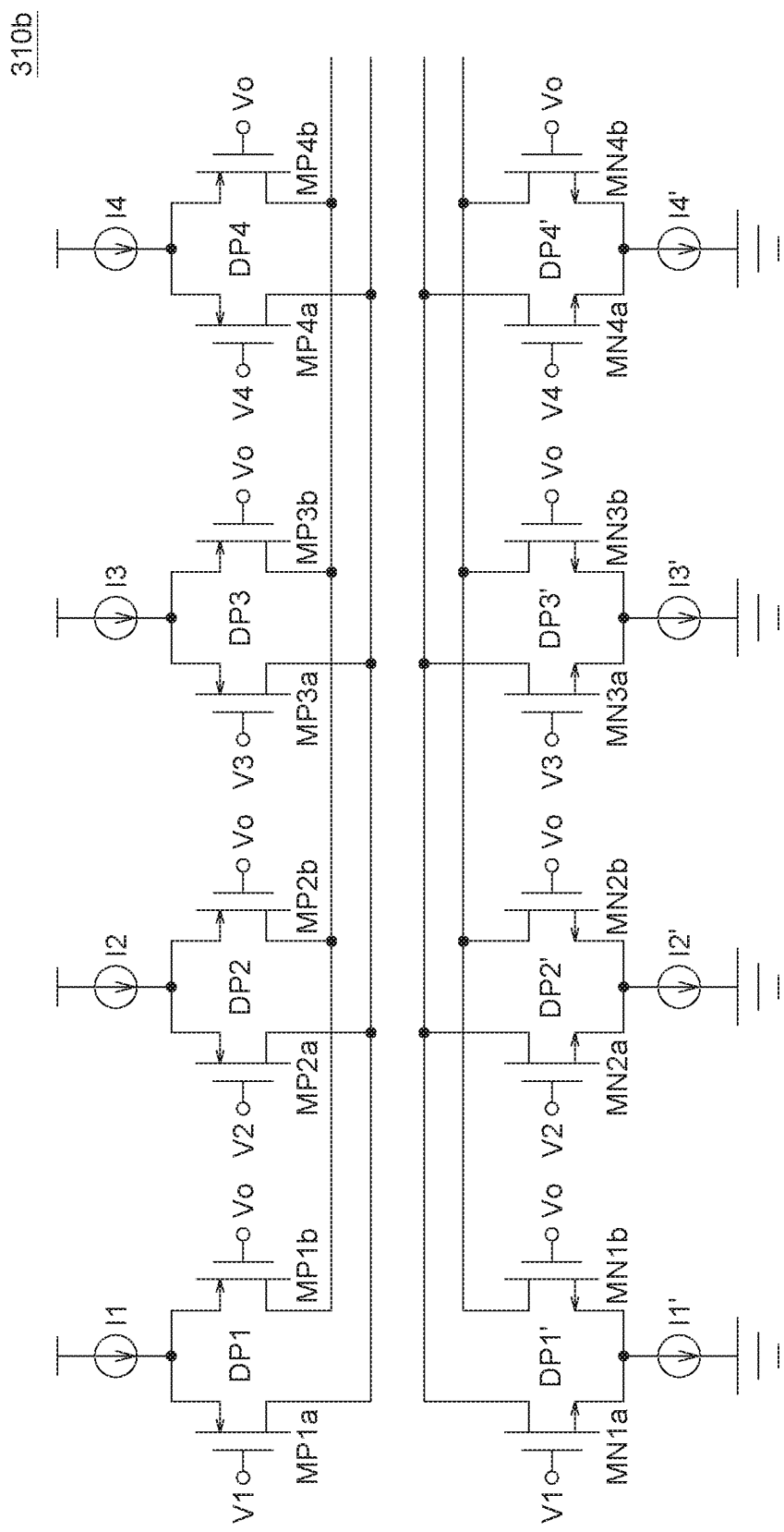
FIG. 3B shows a circuit diagram of a rail-to-rail differential input stage circuit according to one embodiment of this disclosure.

The differential pairs shown in FIG. 3A adopt PMOS transistors. In another embodiment, NMOS transistors may also be applicable. In still another embodiment, PMOS transistors and NMOS transistors may both be included to form a rail-to-rail differential input stage circuit, which is shown in FIG. 3B. The differential input stage circuit 310b includes PMOS differential pairs DP1-DP4 and NMOS differential pairs DP1'-DP4'. The NMOS differential pair DP1' is biased by the current source I1', and receives the input signal V1 and the output signal Vo. The operation principle of the differential input stage circuit 310b is similar to that of the differential input stage circuit 310a shown in FIG. 3A, and thus is not repeated here. The voltage interpolation function in (Eq. 6) can also be achieved.

Figure 4:
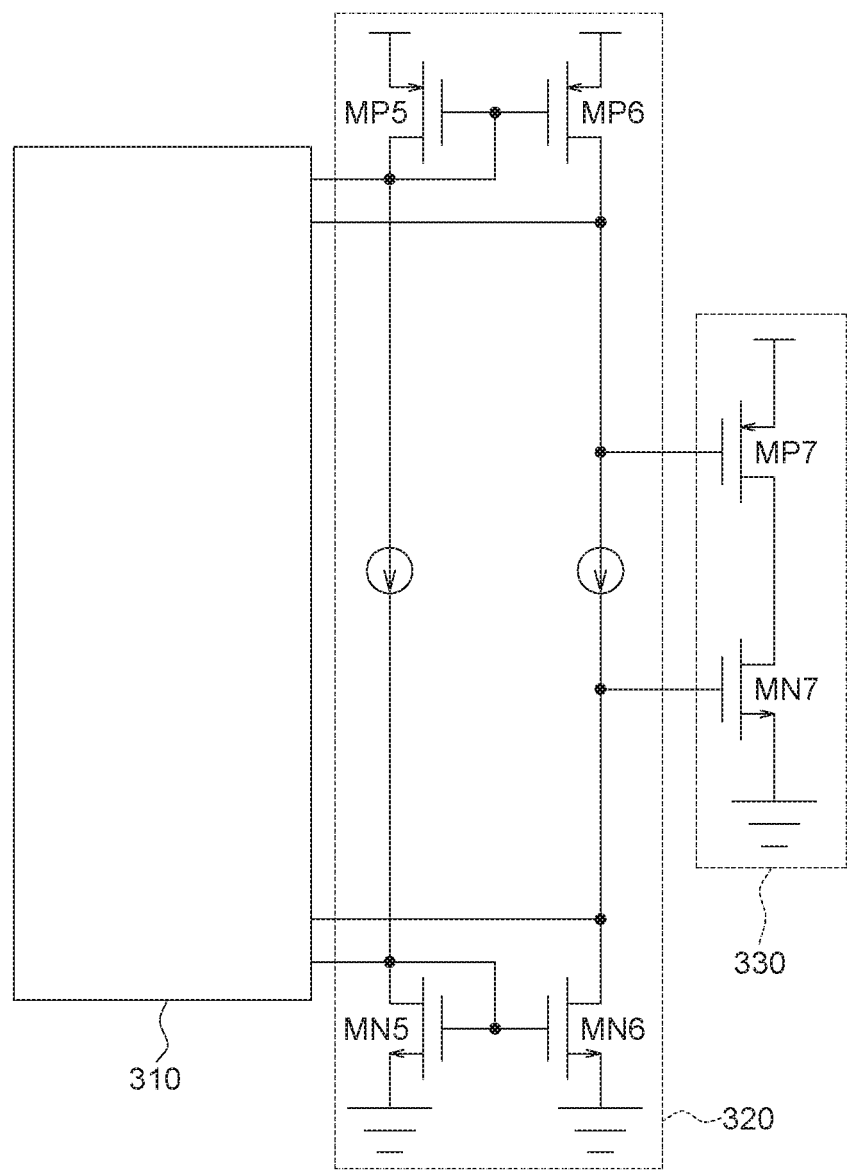
FIG. 4 shows a circuit diagram regarding the loading stage circuit and the output stage circuit according to one embodiment of this disclosure.

FIG. 4 shows a circuit diagram regarding the loading stage circuit and the output stage circuit according to one embodiment of this disclosure. In this embodiment the differential input stage circuit 310 may adopt the rail-to-rail architecture shown in FIG. 3B as an example. The loading stage circuit 320 in this example includes the NMOS transistors MN5, MN6 and PMOS transistors MP5, MP6. The output stage circuit 330 in this example includes the NMOS transistor MN7 and PMOS transistor MP7. FIG. 4 shows merely an exemplary implementation. The circuit architecture for different applications may be modified correspondingly based on the design constraints, such as the voltage gain and bandwidth requirements.

Figure 5:
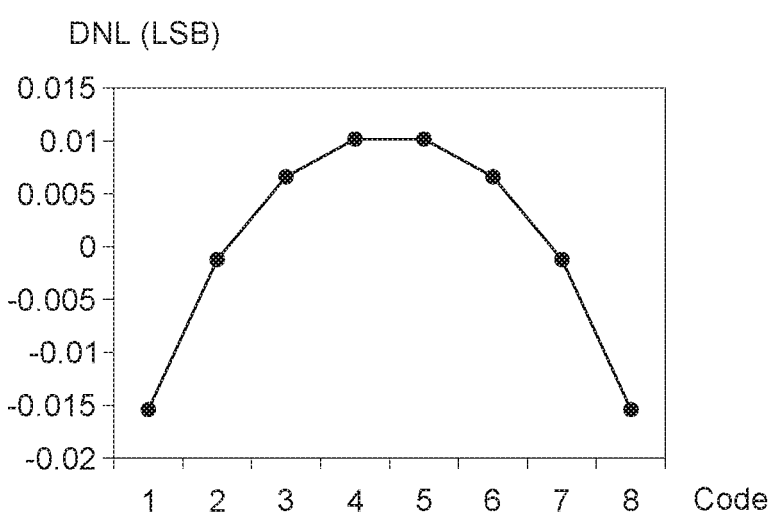
FIG. 5 shows the DNL of the differential difference amplifier circuit according to one embodiment of this disclosure.

As described above, the DDA 30 is preceded by the DAC 10 for converting the digital code X to the analog voltage Vo. The differential nonlinearity (DNL), which represents the deviation between two analog values corresponding to adjacent input digital values, may be obtained according to the circuit structure shown in FIG. 3B and FIG. 4. FIG. 5 shows the DNL of the differential difference amplifier circuit according to one embodiment of this disclosure. As shown in FIG. 5, the circuit structure shown in FIG. 3B and FIG. 4 has a smooth DNL versus input code relationship, which may induce vertical (or horizontal) band in the display panel due to the average characteristic of human eyes. For example, some display regions may be brighter than expected while some display regions may be darker than expected due to the periodic smooth DNL curve and the nature of human visual perception.

TABLE 1

| Code | 000 | 001 | 010 | 011 | 100 | 101 | 110 | 111 |
|---|---|---|---|---|---|---|---|---|
| V1 | VL | VH | VL | VH | VL | VH | VL | VH |
| V2 | VL | VL | VL | VL | VL | VL | VL | VL |
| V3 | VL | VL | VH | VH | VL | VL | VH | VH |
| V4 | VL | VL | VL | VL | VH | VH | VH | VH |
| Vo | VL | $\frac{1}{8}VH + \frac{7}{8}VL$ | $\frac{2}{8}VH + \frac{6}{8}VL$ | $\frac{3}{8}VH + \frac{5}{8}VL$ | $\frac{4}{8}VH + \frac{4}{8}VL$ | $\frac{5}{8}VH + \frac{3}{8}VL$ | $\frac{6}{8}VH + \frac{2}{8}VL$ | $\frac{7}{8}VH + \frac{1}{8}VL$ |

In order to disrupt the smooth DNL shown in FIG. 5 for better display quality, in this disclosure the transconductance of the differential pair in the differential input stage circuit 310 is modulated to randomize the shape of the DNL curve. Several embodiments are given below to illustrate different circuitry for modulating the transconductance of the differential pair.

Figure 6:
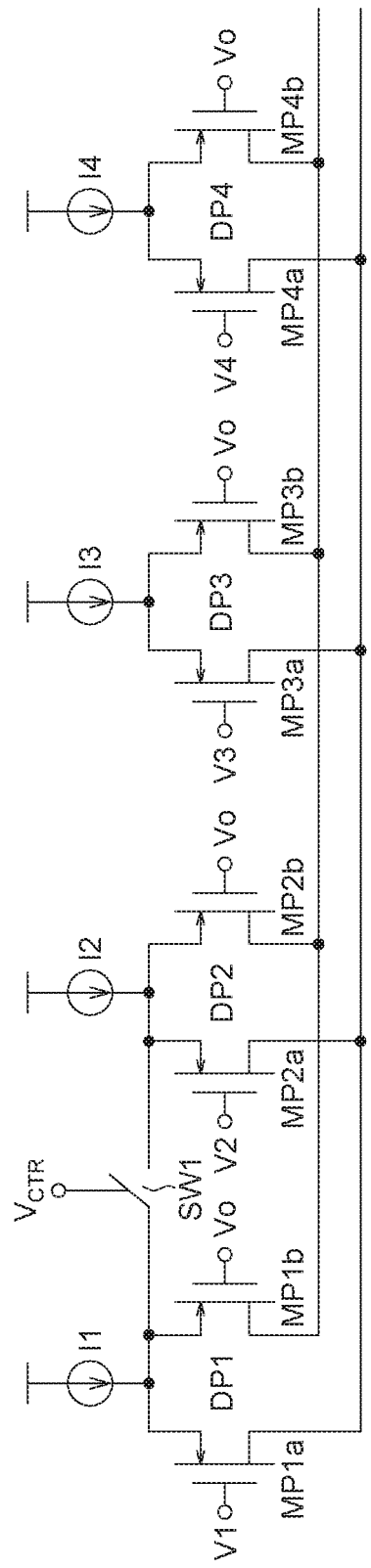
FIG. 6 shows a circuit diagram of a differential input stage circuit according to one embodiment of this disclosure.

FIG. 6 shows a circuit diagram of a differential input stage circuit according to one embodiment of this disclosure. In this embodiment the differential input stage circuit 310c further includes a switch SW1 coupled between the current source I1 and the current source I2, The switch SW1 is controlled by a control signal $V_{CTR}$ generated according to the image data X.

Figure 7:
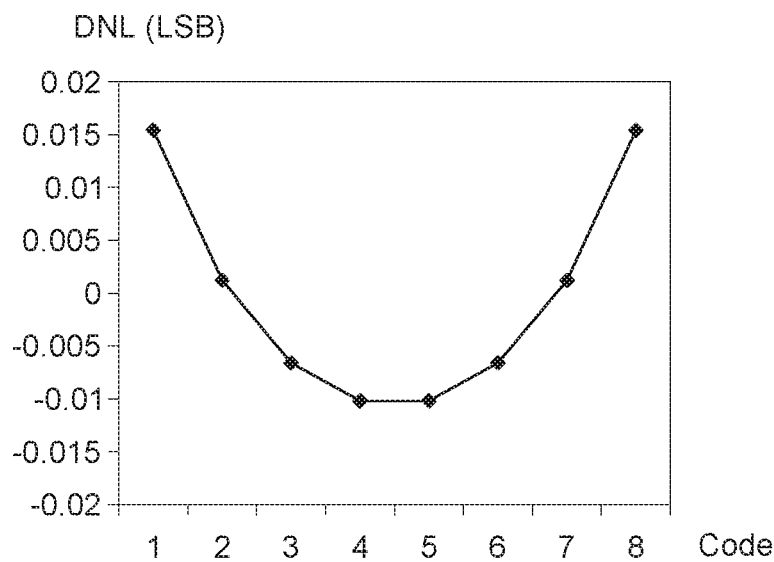
FIG. 7 shows the DNL of the differential difference amplifier circuit according to the circuit structure shown in FIG. 6 when the switch is closed.

When the switch SW1 is open (turned off), the DNL of the differential difference amplifier circuit is shown in FIG. 5. When the switch SW1 is closed (turned on), the current source I1 has a branch current flowing through the transistors MP2a and MP2b. Likewise, the current source I2 has a branch current flowing through the transistors MP1a and MP1b. Therefore, the bias currents for the differential pair DP1 and DP2 change, making the transconductance Gm1 and Gm2 different from the situation when the switch SW1 is open. FIG. 7 shows the DNL of the differential difference amplifier circuit according to the circuit structure shown in FIG. 6 when the switch SW1 is closed. In this embodiment, the DNL is also a smooth curve, however presenting a different shape as compared to the one shown in FIG. 5.

Figure 8A:
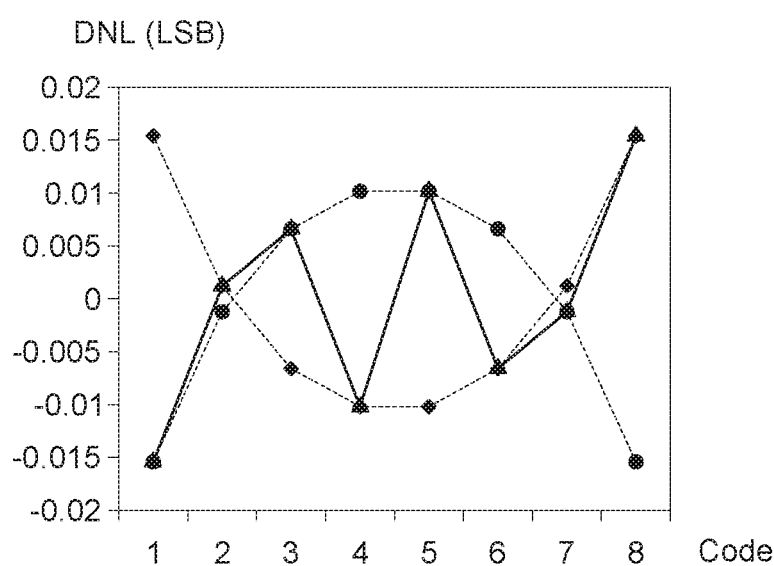
FIG. 8A-FIG. 8C show the DNL of the differential difference amplifier circuit according to the circuit structure shown in FIG. 6 when the switch is controlled by the control signal generated according to the image data.
Figure 8B:
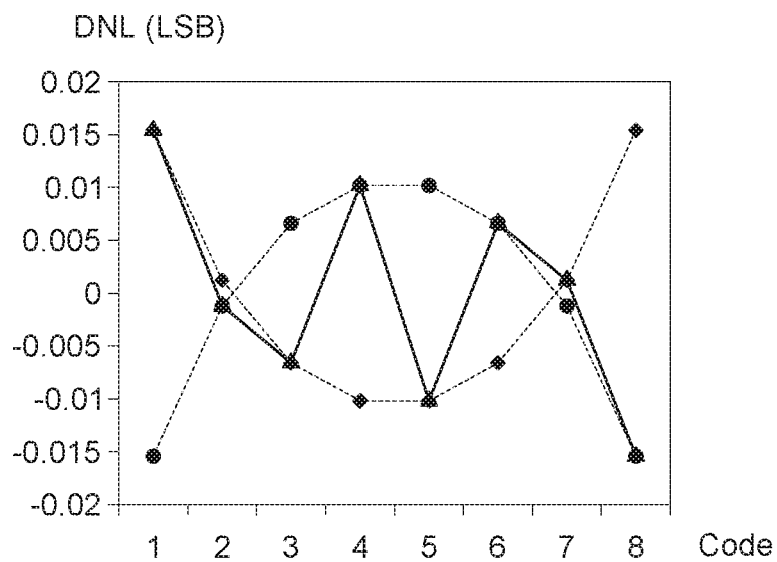
Figure 8C:
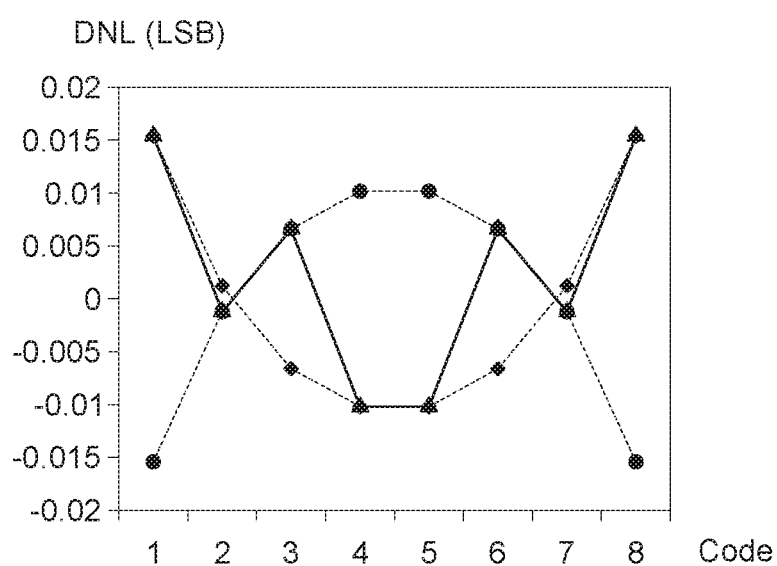

FIG. 8A-FIG. 8C show the DNL of the differential difference amplifier circuit according to the circuit structure shown in FIG. 6 when the switch is controlled by the control signal generated according to the image data. For the sake of explanation, the DNL curve shown in FIG. 5 is referred to as "structure 1," and the DNL curve shown in FIG. 7 is referred to as "structure 2." If the switch SW1 is appropriately controlled, the resultant DNL curve may be a mixture of structure 1 and structure 2. In one embodiment, the switch SW1 is open when the input code (the low part Xb shown in FIG. 1) is an odd number, and the switch SW1 is closed when the input code is an even number. That is, the control signal $V_{CTR}$ is generated according to the least significant bit of the image data X. The resulting DNL curve is shown in FIG. 8A, which is formed by points from structure 1 when the code is 1, 3, 5, 7 and points from structure 2 when the code is 2, 4, 6, 8.

It should be appreciated that the method for setting the control signal $V_{CTR}$ described above is just an example. In another embodiment, the switch SW1 is open when the input code is an even number, and the switch SW1 is closed when the input code is an odd number. The resulting DNL curve is shown in FIG. 8B, which is formed by points from structure 1 when the code is 2, 4, 6, 8 and points from structure 2 when the code is 1, 3, 5, 7.

In still another embodiment, the control signal $V_{CTR}$ is generated according to at least one bit of the image data X. For example, the control signal $V_{CTR}$ may be generated according to the $2^{nd}$ least significant bit of the image data X. The resulting DNL curve is shown in FIG. 8C, which is formed by points from structure 1 when the code is 2, 3, 6, 7 and points from structure 2 when the code is 1, 4, 5, 8.

As can be seen in the embodiments given in FIG. 8A-FIG. 8C, the control signal $V_{CTR}$ is toggled between different input codes, effectively changing the transconductance Gm1 and Gm2, and a pseudo random DNL curve can thus be created.

Figure 9:
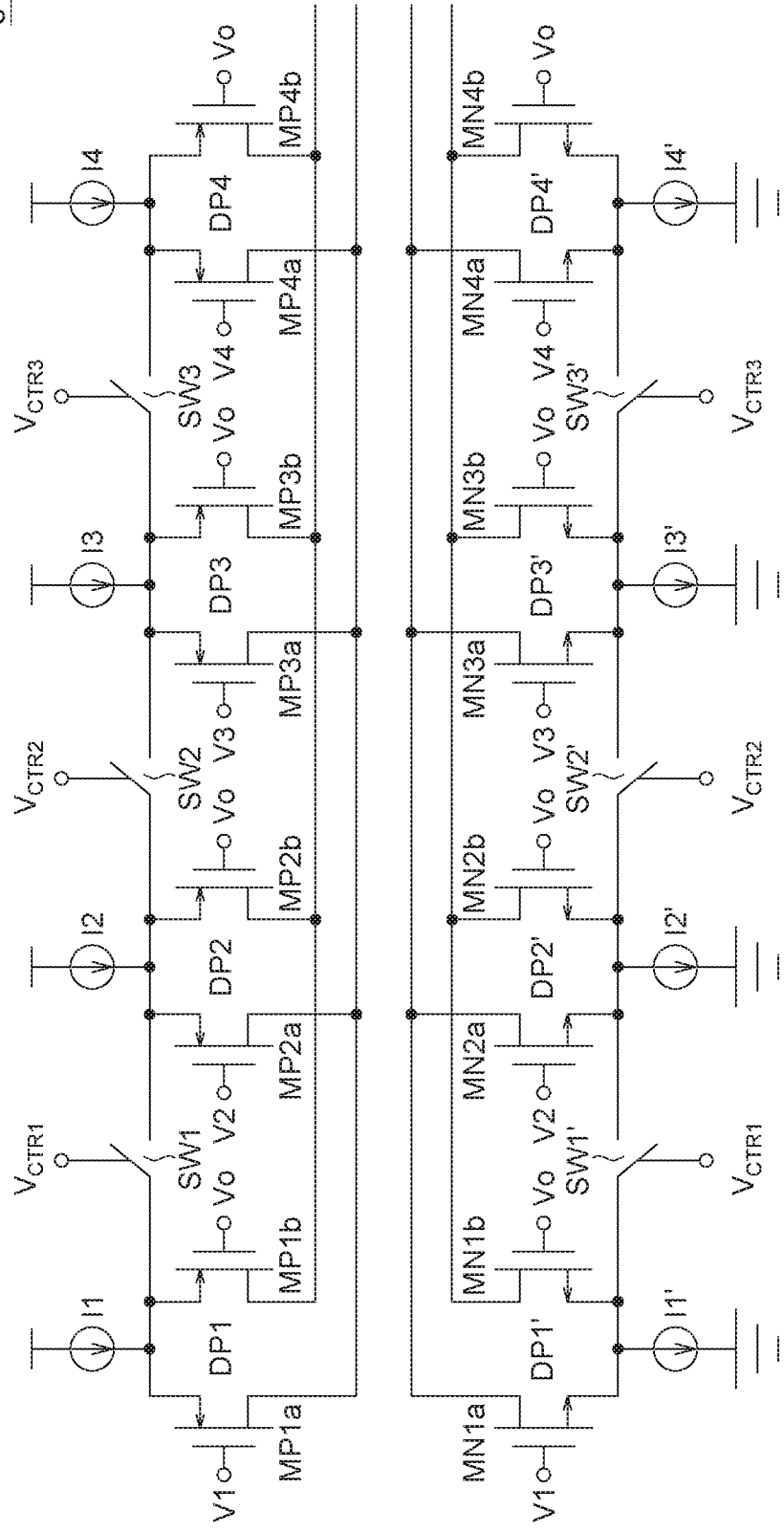
FIG. 9 shows a circuit diagram of a rail-to-rail differential input stage circuit according to one embodiment of this disclosure.

The embodiment shown in FIG. 6 has the switch SW1 coupled between the current source I1 and the current source I2. In other embodiments, the differential input stage circuit may include a switch disposed at a different location, or the differential input stage circuit may include additional switches. FIG. 9 shows a circuit diagram of a rail-to-rail differential input stage circuit according to one embodiment of this disclosure. In this embodiment, the differential input stage circuit 310d includes a switch SW1 coupled between the current source I1 and the current source I2, a switch SW2 coupled between the current source I2 and the current source I3, a switch SW3 coupled between the current source I3 and the current source I4, and switches SW1', SW2', SW3' disposed at positions symmetrical to the switches SW1, SW2, SW3. The switches SW1 and SW1' are controlled by the control signal $V_{CTR1}$, the switches SW2 and SW2' are controlled by the control signal $V_{CTR2}$, and the switches SW3 and SW3' are controlled by the control signal $V_{CTR3}$.

In one embodiment, some of the switches SW1, SW2, SW3 may be optionally removed. For example, switches SW1 and SW1' may be removed. Alternatively, switches SW1, SW1', SW2, and SW2' may be removed. In one embodiment, there may be additional switches coupled between two current sources. For example, there may be an additional switch coupled between the current source I1 and I4. The number of switches and the locations of the switches are not limited in this disclosure. In one embodiment, all the switches in the differential input stage circuit 310d may be controlled by the same control signal. That is, the control signals $V_{CTR1}$, $V_{CTR2}$, $V_{CTR3}$ may be coupled to the same signal source.

As described in relation to FIG. 7, structure 1 may be obtained by opening the switches, and structure 2 may be obtained by closing the switches, Based on the shape of structure 1 and structure 2, the control signals $V_{CTR1}$, $V_{CTR2}$, $V_{CTR3}$ may be appropriately set such that the resulting DNL curve has a pseudo random shape like those shown in FIG. 8A-FIG. 8C.

Embodiments given above involve modulating the transconductance by introducing switches between the current sources. Another approach to modulate the transconductance is to modulate the magnitude of the current source. Referring to the circuit shown in FIG. 3A and FIG. 3B, in one embodiment the magnitude of the current source I1 may be controlled by a control signal generated according to the image data X. By designing the transconductance of at least one input pair different from its typical value, different shape of the DNL curve can be achieved. Note that in the following description the current source I1 will be taken as an example. However, in other embodiments, the magnitude of the current source I2 (as well as the current source I3 and I4) may also be adjusted in a similar way.

Figure 10:
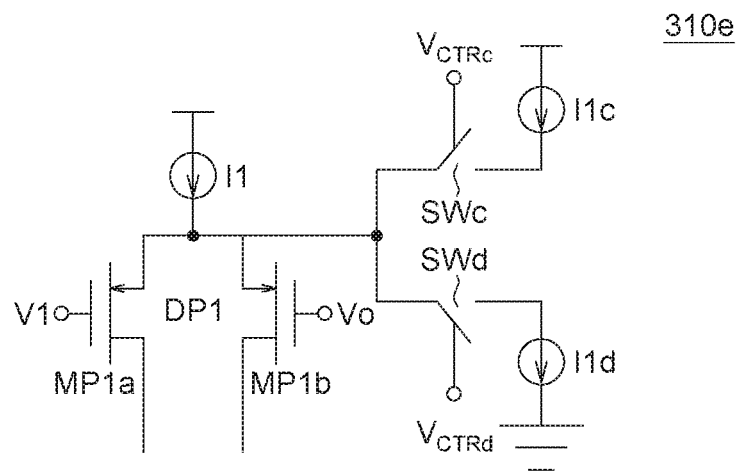
FIG. 10 shows a circuit diagram of a differential pair biased by a current source with a variable magnitude according to one embodiment of this disclosure.

One circuit implementation for adjusting the current magnitude is to add an extra current source. FIG. 10 shows a circuit diagram of a differential pair biased by a current source with a variable magnitude according to one embodiment of this disclosure. The differential input stage circuit 310e includes differential pairs DP1-DP4 as shown in FIG. 3A, and only the differential pair DP1 is illustrated in FIG. 10 for sake of simplicity and clarity. As shown in FIG. 10, a switch SWc is coupled between the current source I1 and a charging current source I1c. A switch SWd is coupled between the current source I1 and a discharging current source I1d. In one embodiment, either the charging current source I1c or the discharging current source I1d may be optionally removed. The charging current source I1c is configured to increase a current flowing into the differential pair DP1. The switch SWc is controlled by the control signal $V_{CTRc}$. The discharging current source I1d is configured to decrease a current flowing into the differential pair DP1. Moreover, in one embodiment, the charging source I1c in each data driver amplifier may have different current magnitude. In one embodiment, the discharging current source I1d in each data driver amplifier may have different current magnitude. The switch SWd is controlled by the control signal $V_{CTRd}$. The control signal $V_{CTRc}$ and $V_{CTRd}$ may both be generated according to the image data X. For example, similar to the embodiments in FIG. 8A to FIG. 8C, the switches SWc or the switched SWd may be controlled according to at least one bit of the image data X. By adjusting the bias current of the differential pair DP1, the ratio between transconductance of multiple differential pairs DP1-DP4 can be adjusted, and thus DNL randomization can be achieved for better display quality.

Figure 11:
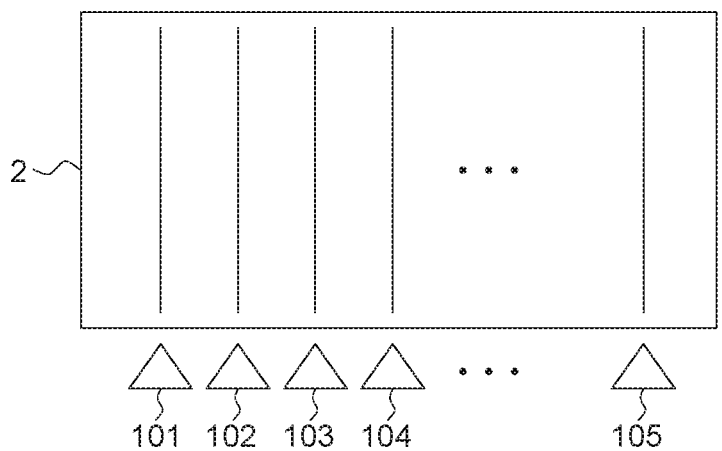
FIG. 11 shows multiple data drivers disposed at one side of the display panel according to one embodiment of this disclosure.

FIG. 11 shows multiple data drivers disposed at one side of the display panel according to one embodiment of this disclosure. Each data driver amplifier 101-105 may provide image data to one or multiple data lines of the display panel 2, and each data driver amplifier 101-105 may adopt the circuit structures shown in FIG. 1, FIG. 2, FIG. 3A, and FIG. 10. As such, each data driver amplifier 101-105 can modulate the magnitude of the current source in response to the respective driving image data. Therefore, the DNL curve not only varies with different codes as described above, but also varies with different locations in the display panel. In other words, nearby data drivers may use different modulation (having different transconductance) because of different codes or different locations to achieve spatial compensation.

Figure 12:
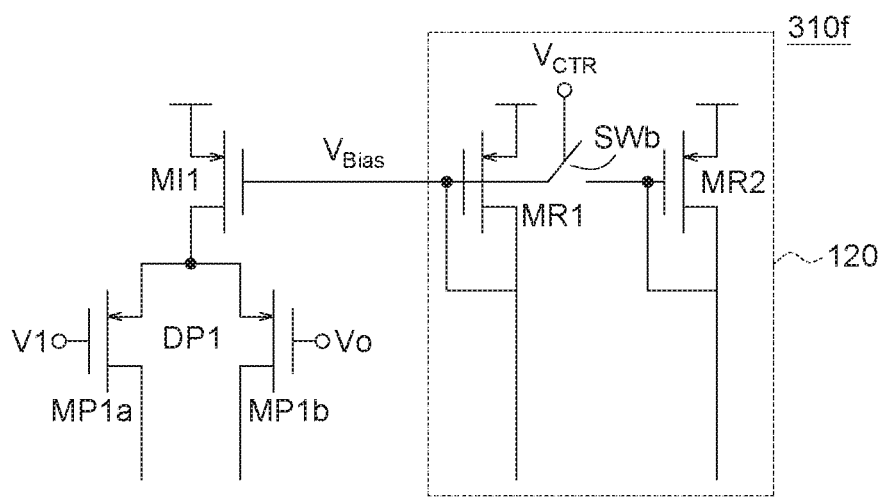
FIG. 12 shows a circuit diagram of a differential pair biased by a current source controlled by a bias voltage according to one embodiment of this disclosure.

In addition to introducing an extra current source, another circuit implementation for adjusting the current magnitude is to adjust the bias voltage of the current source. FIG. 12 shows a circuit diagram of a differential pair biased by a current source controlled by a bias voltage according to one embodiment of this disclosure. The differential input stage circuit 310f includes differential pairs DP1-DP4 as shown in FIG. 3A, and only the differential pair DP1 is illustrated in FIG. 12 for sake of simplicity and clarity. In this embodiment, the magnitude of the current source I1 is controlled by the bias voltage $V_{Bias}$ generated by a bias generation circuit 120. The bias generation circuit 120 includes transistors MR1 and MR2, and a switch SWb coupled between the control terminal of the transistor MR1 (the control terminal is for example the gate terminal of the MOSFET) and the control terminal of the transistor MR2. The switch SWb is controlled by the control signal $V_{CTR}$. In one embodiment, the control signal $V_{CTR}$ is generated according to the image data X. Similar to the embodiment shown in FIG. 10, by adjusting the bias voltage of the current source I1, the ratio between transconductance of multiple differential pairs DP1-DP4 can be adjusted, and thus DNL randomization can be achieved for better display quality.

Figure 13:
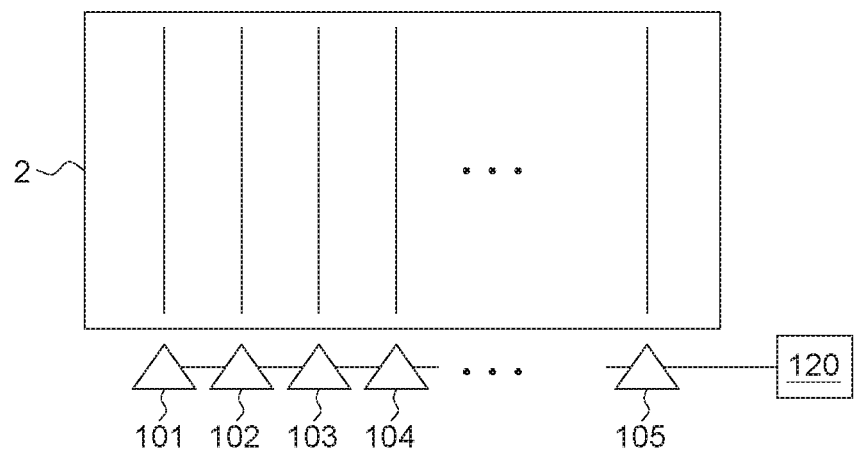
FIG. 13 shows a bias generation circuit shared by multiple data drivers according to one embodiment of this disclosure.

Refer to the multiple channels of data driver amplifiers 101-105 shown in FIG. 11. In one embodiment, each data driver amplifier 101-105 may adopt the circuit structures shown in FIG. 1, FIG. 2, FIG. 3A, and FIG. 12. Moreover, each data driver amplifier 101-105 may share a common bias generation circuit 120, effectively saving the circuit area. That is, the gate terminals of the transistors MI1 in the multiple data driver amplifiers 101-105 may be coupled together to the gate terminal of the same transistor MR1. FIG. 13 shows a bias generation circuit shared by multiple channels of data driver amplifiers according to one embodiment of this disclosure. In this embodiment, the bias generation circuit 120 including the transistor MR1 and MR2 provides the bias voltage $V_{Bias}$ to multiple channels of data driver amplifiers 101-105. As such, multiple channels of data driver amplifiers 101-105 may share the common control signal $V_{CTR}$ to achieve global control.

In one embodiment, the differential pair DP1 in each data driver amplifier 101-105 may be coupled to a first bias voltage $V_{bias1}$, which may be adjusted according to the control signal $V_{CTR}$ as described above. The differential pair DP2 (as well as DP3 and DP4) in each data driver amplifier 101-105 may be coupled to a second bias voltage $V_{bias2}$, which may be a constant voltage level.

In one embodiment, the control signal VCTR may change with time, such as being controlled by a timing control signal. For example, the control signal VCTR may change polarity in adjacent image frames, or change polarity for every two (or more) image frames. The corresponding bias voltage VBias may be alternatively set as 1.1V in the 1st image frame, 1.0V in the 2st image frame, 1.1V in the 3rd image frame, 1.0V in the 4th image frame, and so on. As such, the transconductance of the differential pairs change with time. Therefore, the DNL curve is randomized in time domain as well, such that timing compensation can be achieved.

Figure 14:
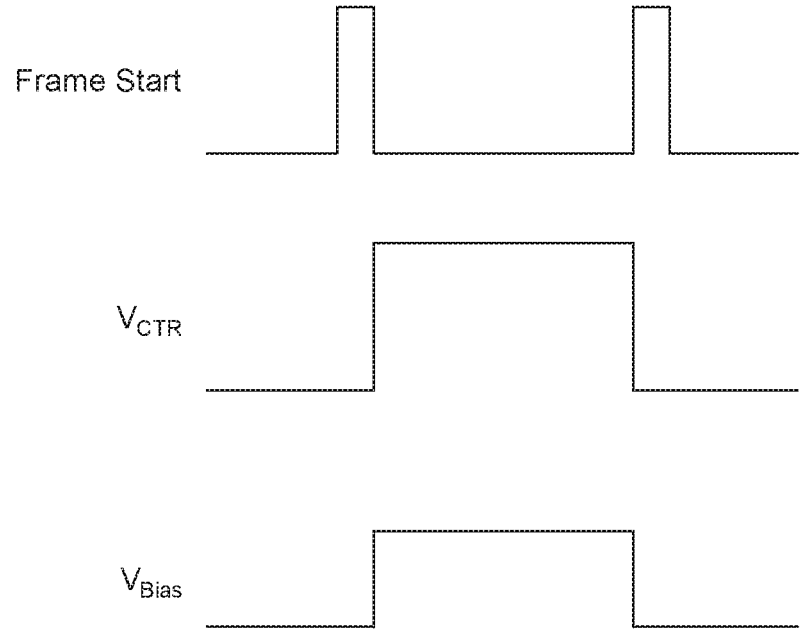
FIG. 14 shows a signal waveform of the circuit shown in FIG. 12 according to one embodiment of this disclosure.
Figure 15:
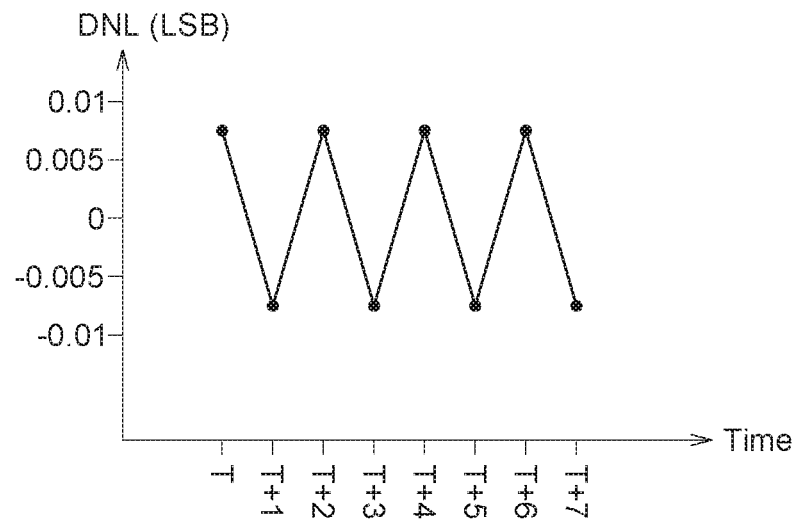
FIG. 15 shows the DNL of the differential difference amplifier circuit according to the circuit structure shown in FIG. 12 when the control signal changes polarity in adjacent image frames.

FIG. 14 shows a signal waveform of the circuit shown in FIG. 12 according to one embodiment of this disclosure. This signal waveform is corresponding to the example given above, where the control signal $V_{CTR}$ changes polarity in adjacent image frames. In one embodiment, the control signal $V_{CTR}$ changes in response to a frame start signal, which indicates the start of an image frame. For example, the control signal $V_{CTR}$ changes whenever the frame start signal triggers, or changes when the frame start signal has triggered a predetermined number of times. The switch SWb in FIG. 12 is closed when the control signal $V_{CTR}$ is high, and the bias voltage $V_{Bias}$ increases correspondingly (such as increasing from 1.0V to 1.1V). FIG. 15 shows the DNL of the differential difference amplifier circuit according to the circuit structure shown in FIG. 12 when the control signal changes polarity in adjacent image frames. In FIG. 15 the DNL is plotted versus the time axis given the same input digital code. Because the magnitude of the bias current for the differential pair changes every image frame, the DNL changes every image frame even if the input code is kept the same.

Figure 16:
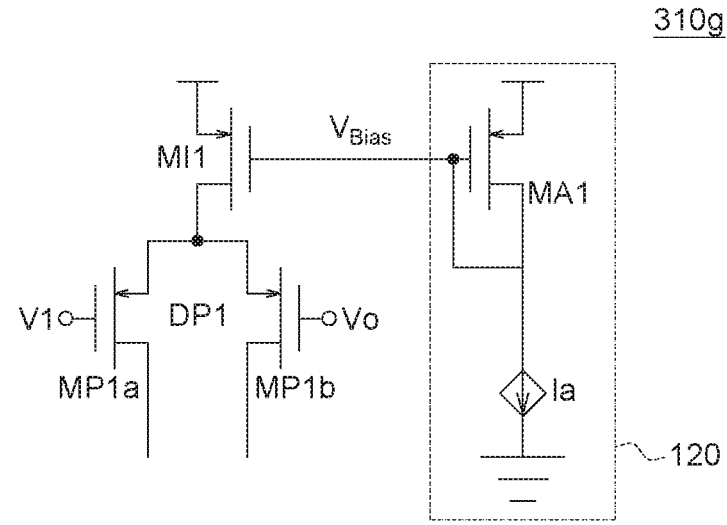
FIG. 16 shows a circuit diagram of a differential pair biased by a current source controlled by a variable current source according to one embodiment of this disclosure.

The following embodiment provides a different implementation for the bias generation circuit 120 shown in FIG. 13. FIG. 16 shows a circuit diagram of a differential pair biased by a current source controlled by a variable current source according to one embodiment of this disclosure. The differential input stage circuit 310g includes differential pairs DP1-DP4 as shown in FIG. 3A, and only the differential pair DP1 is illustrated in FIG. 16 for sake of simplicity and clarity. In this embodiment, the magnitude of the current source I1 is controlled by the bias voltage $V_{Bias}$ generated by a bias generation circuit 120. The bias generation circuit 120 includes a transistor MA1 and a variable current source Ia coupled to the transistor MA1. For example, the variable current source Ia is a voltage controlled current source, and the magnitude of the variable current source Ia is controlled by the control signal $V_{CTR}$. As mentioned in the previous embodiments, the control signal $V_{CTR}$ may change in response to the frame start signal. In one embodiment, the control signal $V_{CTR}$ changes polarity in adjacent image frames.

Based on the embodiments given above, the transconductance of the differential pair in the differential difference amplifier circuit can be dynamically adjusted according to the image data or time. For local control, the DNL shape can be modulated by the image data, and hence the DNL curve varies with different input codes. The advantage of local control is that nearby data drivers can use different modulation to achieve spatial compensation. For global control, multiple data drivers can be coupled together and controlled synchronously by the timing control signal. Different modulation method can be used at different timing for timing compensation. Hybridization of both local and global control can accomplish both spatial and timing compensation for even better display quality. The differential difference amplifier circuit provided in this disclosure can be applied to OLED, LCD, or other types of high resolution display devices.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A differential difference amplifier circuit in a data driver for providing image data to a display panel, the differential difference amplifier circuit comprising:
    a differential input stage circuit, comprising:
        a first differential pair having a first transconductance, wherein the first differential pair is biased by a first current source and receives a first input signal and an output signal; and
        a second differential pair having a second transconductance, wherein the second differential pair is biased by a second current source and receives a second input signal and the output signal;
    a loading stage circuit coupled to the differential input stage circuit; and
    an output stage circuit coupled to the loading stage circuit, wherein the output stage circuit is configured to generate the output signal;
    wherein at least one of the first transconductance and the second transconductance is adjusted according to the image data, a control signal is generated by the data driver according to at least one bit of the image data.

2. The differential difference amplifier circuit according to claim 1, wherein the differential input stage circuit further comprises a first switch coupled between the first current source and the second current source, and the first switch is controlled by the control signal.

3. The differential difference amplifier circuit according to claim 2, wherein the differential input stage circuit further comprises a third differential pair and a second switch, the third differential pair receives a third input signal and the output signal, the third differential pair is biased by a third current source, the second switch is coupled between the second current source and the third current source, and the second switch is controlled by the control signal.

4. The differential difference amplifier circuit according to claim 1, wherein the control signal is generated according to the least significant bit of the image data.

5. The differential difference amplifier circuit according to claim 1, wherein a magnitude of the first current source is controlled by a control signal generated according to the image data.

6. The differential difference amplifier circuit according to claim 5, wherein the differential input stage circuit further comprises a charging current source and a first switch coupled between the charging current source and the first current source, wherein the charging current source is configured to increase a current flowing into the first differential pair, and the first switch is controlled by the control signal.

7. The differential difference a mplifier circuit according to claim 5, wherein the differential input stage circuit further comprises a discharging current source and a second switch coupled between the discharging current source and the first current source, wherein the discharging current source is configured to decrease a current flowing into the first differential pair.

8. The differential difference amplifier circuit according to claim 5, wherein the magnitude of the first current source is controlled by a bias voltage generated by a bias generation circuit, wherein the bias generation circuit comprises a first transistor, a second transistor, and a third switch coupled between a control terminal of the first transistor and a control terminal of the second transistor, and the third switch is controlled by the control signal.

9. The differential difference amplifier circuit according to claim 8, wherein the control signal changes polarity in adjacent image frames.

* * * * *